(12) United States Patent
Yamauchi et al.

(10) Patent No.: US 11,171,617 B2
(45) Date of Patent: Nov. 9, 2021

(54) POWER AMPLIFYING DEVICE AND AUDIO EQUIPMENT

(71) Applicants: Kabushiki Kaisha Toshiba, Tokyo (JP); Toshiba Electronic Devices & Storage Corporation, Tokyo (JP)

(72) Inventors: Akira Yamauchi, Yokohama Kanagawa (JP); Hiroyuki Tsurumi, Fujisawa Kanagawa (JP)

(73) Assignees: Kabushiki Kaisha Toshiba, Tokyo (JP); Toshiba Electronic Devices and Storage Corporation, Tokyo (JP)

( * ) Notice: Subject to any disclaimer, the term of this patent is extended or adjusted under 35 U.S.C. 154(b) by 133 days.

(21) Appl. No.: 16/563,195

(22) Filed: Sep. 6, 2019

(65) Prior Publication Data

US 2020/0162040 A1   May 21, 2020

(30) Foreign Application Priority Data

Nov. 21, 2018 (JP) .............................. JP2018-218437

(51) Int. Cl.
| | | |
|---|---|---|
| *H03F 3/217* | (2006.01) | |
| *H03F 3/21* | (2006.01) | |
| *H03F 3/45* | (2006.01) | |
| *H04R 3/00* | (2006.01) | |
| *H03G 3/30* | (2006.01) | |

(52) U.S. Cl.
CPC ......... *H03F 3/211* (2013.01); *H03F 3/45179* (2013.01); *H03G 3/3026* (2013.01); *H04R 3/00* (2013.01); *H03F 2200/03* (2013.01)

(58) Field of Classification Search
CPC ........... H03F 3/72; H03F 3/217; H03F 3/2171

USPC .................................... 330/51, 251; 381/120
See application file for complete search history.

(56) References Cited

U.S. PATENT DOCUMENTS

| | | | |
|---|---|---|---|
| 7,813,515 B2 | 10/2010 | Botti et al. | |
| 8,330,539 B2 | 12/2012 | Hissink et al. | |
| 8,552,799 B2 | 10/2013 | Tsurumi | |
| 9,602,070 B2 | 3/2017 | Tsurumi | |
| 2005/0187645 A1* | 8/2005 | Matsushita | ......... H04M 1/0245 |
| | | | 700/94 |

FOREIGN PATENT DOCUMENTS

| | | |
|---|---|---|
| JP | 2001-168658 A | 6/2001 |
| JP | 2007-49275 A | 2/2007 |
| JP | 2009-55530 A | 3/2009 |
| JP | 2013-42285 A | 2/2013 |
| JP | 2016-174206 A | 9/2016 |

* cited by examiner

*Primary Examiner* — Steven J Mottola

(57) ABSTRACT

A power amplifying device according to an embodiment includes first to fourth BTL amplifiers and first to third switch circuits. The first to fourth BTL amplifiers outputs a first to fourth output signal. The first switch circuit is turned on or off connection between an output of the second output amplifier and an output of the third output amplifier. The second switch circuit is turned on or off connection between an output of the fifth output amplifier and an output of the eighth output amplifier. The third switch circuit is turned on or off connection between an output of the fourth output amplifier and an output of the seventh output amplifier. The first to third switch circuits are turned on when the amplitudes of the first to fourth input signals are smaller than a first threshold.

18 Claims, 12 Drawing Sheets

POWER AMPLIFYING DEVICE AND AUDIO EQUIPMENT

CROSS-REFERENCE TO RELATED APPLICATIONS

This application is based upon and claims the benefit of priority from Japanese Patent Application No. 2018-218437, filed on Nov. 21, 2018; the entire contents of which are incorporated herein by reference.

FIELD

An embodiment described herein relates to a power amplifying device and audio equipment.

BACKGROUND

Power amplifying devices for car audio equipment typically have a B-class or AB-class bridge circuit configuration and are installed in a limited space. The car audio equipment has problems in that it is difficult to install a large heat radiating device, such as a radiator fin, and semiconductor devices of the audio equipment are damaged by heat and have a reduced life time.

Recent car audio equipment tends to have higher power and more channels and to be multimedia-ready. In this trend, there is an increasing demand for a high-efficiency power amplifier system that generates less heat. One of common on-vehicle power amplifying devices having a single power supply rail is a power amplifying device of a multi-stage vertical configuration.

With the multi-stage vertical configuration, however, the single power supply rail needs to be divided into multiple stages to produce a bias voltage, and each of the bridge amplifiers vertically stacked needs to be driven within the range of the bias voltage. Therefore, if the power supply voltage is low, the voltage applied to the bridge amplifier is also low, and it is difficult to achieve bridge amplification. Thus, in the conventional power amplifying devices, it is difficult to further reduce the consumed current.

DETAILED DESCRIPTION

Figure 1:
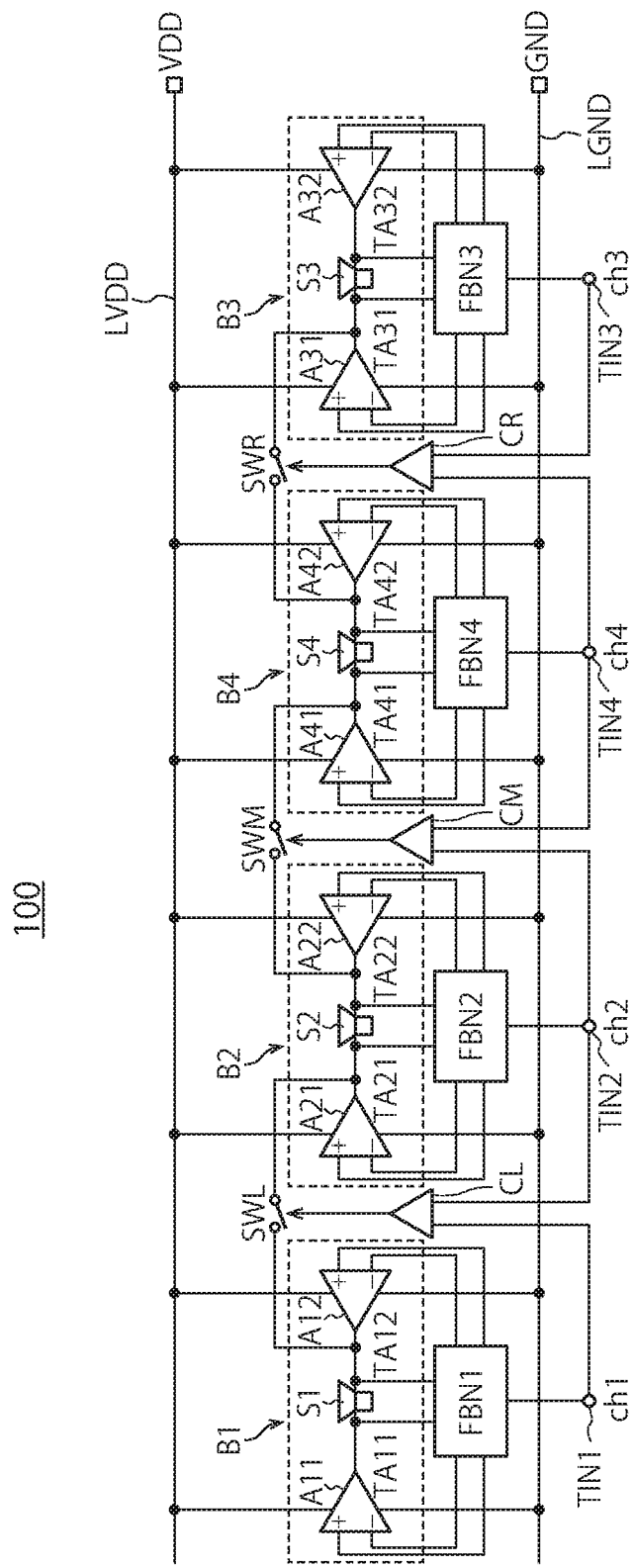
FIG. 1 is a diagram showing a configuration example of a switching power supply according to an embodiment.

A power amplifying device according to an embodiment includes first to fourth BTL amplifiers and first to third switch circuits. The first BTL amplifier includes bridge-connected first and second output amplifiers and outputs a first output signal obtained by amplifying a first input signal. The second BTL amplifier includes bridge-connected third and fourth output amplifiers and outputs a second output signal obtained by amplifying a second input signal. The third BTL amplifier includes bridge-connected fifth and sixth output amplifiers and outputs a third output signal obtained by amplifying a third input signal. The fourth BTL amplifier includes bridge-connected seventh and eighth output amplifiers and outputs a fourth output signal obtained by amplifying a fourth input signal. The first switch circuit is turned on to establish connection between an output of the second output amplifier and an output of the third output amplifier or is turned off to break the connection between the output of the second output amplifier and the output of the third output amplifier. The second switch circuit is turned on to establish connection between an output of the fifth output amplifier and an output of the eighth output amplifier or is turned off to break the connection between the output of the fifth output amplifier and the output of the eighth output amplifier. The third switch circuit is turned on to establish connection between an output of the fourth output amplifier and an output of the seventh output amplifier or is turned off to break the connection between the output of the fourth output amplifier and the output of the seventh output amplifier. The first to third switch circuits are turned on when the amplitudes of the first to fourth input signals are smaller than a first threshold.

The embodiment of the present invention is explained below with reference to the drawings. In the drawings attached to this specification, for convenience of easiness of understanding of illustration, scales, aspect ratios, and the like are changed from actual ones and exaggerated.

Embodiment

FIG. 1 is a configuration diagram showing an example of an audio system including a power amplifying device 100 according to an embodiment. The power amplifying device 100 includes a first potential line LVDD, a second potential line LGND, first to fourth BTL amplifiers B1 to B4, first to third switch circuits SWL, SWR, and SWM, first to fourth control circuits FBN1 to FBN4, and first to third comparators CL, CR, and CM. The power amplifying device 100 may be used in car audio equipment or the like.

First potential (a power supply voltage) VDD is supplied to the first potential line LVDD. Second potential (a ground voltage) GND lower than the first potential VDD is supplied to the second potential line LGND. To simplify explanation, the second potential (the ground voltage) according to this embodiment is treated as GND=0.

Each of the first to fourth BTL amplifiers B1 to B4 includes two amplifiers of a BTL (Bridge Tied Load or Balanced Transless) type in which output-stage transistors include bridge-connected output bridge circuits.

The first BTL amplifier B1 includes bridge-connected output amplifiers A11 and A12. The output amplifiers A11 and A12 include current supply terminals, current sweep-out terminals, and output terminals TA11 and TA12. A speaker S1, which is a load, is connected between the output terminals TA11 and TA12. The first BTL amplifier B1 outputs a first output signal obtained by amplifying the first input signal (a signal in a first channel Ch1) input to an input terminal TIN1. The first output signal is output (a load current flows) to between the output terminals TA11 and TA12, whereby sound corresponding to the first input signal is output from the speaker S1.

The second BTL amplifier B2 includes bridge-connected output amplifiers A21 and A22. The output amplifiers A21 and A22 include current supply terminals, current sweep-out terminals, and output terminals TA21 and TA22. A speaker S2, which is a load, is connected between the output terminals TA21 and TA22 of the output amplifiers A21 and A22. The second BTL amplifier B2 outputs a second output signal obtained by amplifying the second input signal (a signal in a second channel Ch2) input to an input terminal TIN2. The second output signal is output (a load current flows) to between the output terminals TA21 and TA22 of the output amplifiers A21 and A22, whereby sound corresponding to the second input signal is output from the speaker S2.

The third BTL amplifier B3 includes bridge-connected output amplifiers A31 and A32. The output amplifiers A31 and A32 include current supply terminals, current sweep-out terminals, and output terminals TA31 and TA32. A speaker S3, which is a load, is connected between the output terminals TA31 and TA32 of the output amplifiers A31 and A32. The third BTL amplifier B3 outputs a third output signal obtained by amplifying the third input signal (a signal in a third channel Ch3) input to an input terminal TIN3. The third output signal is output (a load current flows) to between the output terminals TA31 and TA32 of the output amplifiers A31 and A32, whereby sound corresponding to the third input signal is output from the speaker S3.

The fourth BTL amplifier B4 includes bridge-connected output amplifiers A41 and A42. The output amplifiers A41 and A42 include current supply terminals, current sweep-out terminals, and output terminals TA41 and TA42. A speaker S4, which is a load, is connected between the output terminals TA41 and TA42 of the output amplifiers A41 and A42. The fourth BTL amplifier B4 outputs a fourth output signal obtained by amplifying the fourth input signal (a signal in a fourth channel Ch4) input to an input terminal TIN4. The fourth output signal is output (a load current flows) to between the output terminals TA41 and TA42 of the output amplifiers A41 and A42, whereby sound corresponding to the fourth input signal is output from the speaker S4.

The first switch circuit SWL is turned on to establish connection between the output terminals of the output amplifier A12 and the output amplifier A21 or is turned off to break the connection between the output terminals of the output amplifier A12 and the output amplifier A21 according to the first and second input signals. The second switch circuit SWR is turned on to establish connection between the output terminals TA31 and TA42 of the output amplifier A31 and the output amplifier A42 or is turned off to break the connection between the output terminals TA31 and TA42 of the output amplifier A31 and the output amplifier A42 according to the third and fourth input signals. The third switch circuit SWM is turned on to establish connection between the output terminals TA22 and TA41 of the output amplifier A22 and the output amplifier A41 or is turned off to break the connection between the output terminals TA22 and TA41 of the output amplifier A22 and the output amplifier A41 according to the first to fourth input signals.

A first threshold Th1 and a second threshold Th2 have a magnitude relation of the second threshold Th2>the first threshold Th1. That is, the first threshold Th1 is a value smaller than the second threshold Th2.

When both of the amplitudes of the first and second input signals are smaller than the second threshold Th2, the first comparator CL outputs a signal for turning on the first switch circuit SWL. On the other hand, when at least one of the amplitudes of the first and second input signals is equal to or larger than the second threshold Th2, the first comparator CL outputs a signal for turning off the first switch circuit SWL. The second threshold Th2 corresponds to time when the amplitudes of the first and second output signals are VDD/2. That is, the amplitudes of the first and second output signals are smaller than VDD/2 when the amplitudes of the first and second input signals are smaller than the second threshold Th2.

When both of the amplitudes of the third and fourth input signals are smaller than the second threshold Th2, the second comparator CR outputs a signal for turning on the second switch circuit SWR. On the other hand, when at least one of the amplitudes of the third and fourth input signals is equal to or larger than the second threshold Th2, the second comparator CR outputs a signal for turning off the second switch circuit SWR. The second threshold Th2 corresponds to time when the amplitudes of the third and fourth output signals are VDD/2. That is, the amplitudes of the third and fourth output signals are smaller than VDD/2 when the amplitudes of the third and fourth input signals are smaller than the second threshold Th2.

When both of the amplitudes of the second and fourth input signals are smaller than the first threshold Th1, the third comparator CM outputs a signal for turning on the third switch circuit SWM. On the other hand, when at least one of the amplitudes of the second and fourth input signals is equal to or larger than the first threshold Th1, the third comparator CM outputs a signal for turning off the third switch circuit SWM. The first threshold Th1 is the same value as the amplitudes of the second and fourth input signals corresponding to time when the amplitudes of the second and fourth output signals is VDD/4. That is, the amplitudes of the second and fourth output signals are smaller than VDD/4 when the amplitudes of the second and fourth input signals are smaller than the first threshold Th1.

A state in which the first to third switch circuits SWL, SWR, and SWM are on is referred to as small signal mode. A state in which the first and second switch circuits SWL and SWR are on and the third switch circuit SWM is off is referred to as medium signal mode. A state in which the first to third switch circuits SWL, SWR, and SWM are off is referred to as large signal mode.

The first control circuit FBN1 controls the outputs of the output amplifiers A11 and A12 according to a state (on/off) of the first switch circuit SWL, a state (on/off) of the third switch circuit SWM, and the first input signal. The first control circuit FBN1 controls gains of the output amplifiers A11 and A12 such that a differential gain of the first BTL amplifier B1 is a prescribed value.

The first control circuit FBN1 has a control loop for, during the small signal mode, controlling a common mode voltage of output potential of the output amplifier A12 to supply the output potential of the output amplifier A12, which is a reference output, to output potential of the output amplifier A21 via the first switch circuit SWL and equalize output currents of the output amplifiers A12 and A21. In the small signal mode, the control is so-called SEPP (Single Ended Push-Pull) control.

The first control circuit FBN1 has a control loop for, during the medium signal mode, controlling a common mode voltage of output potentials of the output amplifiers A12 and A21 to fix the output potential of the output amplifier A12, which is the reference output, to approximately VDD/2 and equalize output currents of the output amplifiers A12 and A21. That is, when the first switch circuit SWL is on, the first control circuit FBN1 controls the output amplifiers A12 and A21 to operate as parallel amplifiers. In the medium signal mode, the control is so-called SEPP control.

Further, the first control circuit FBN1 controls output potentials of the output amplifiers A11 and A12 immediately before turn-off of the first switch circuit SWL to be maintained as a common mode voltage unless an output of the output amplifier A12 is clipped when the first switch circuit SWL is off in the large signal mode. In the large signal mode, the control is so-called BTL (Balanced Transformer Less) control.

When the first input signal is null, the first control circuit FBN1 sets direct-current voltages at the output terminals TA11 and TA12 to third potential. The third potential is set to, for example, VDD/2, which is medium potential of the second potential GND and the first potential VDD.

The second control circuit FBN2 controls the outputs of the output amplifiers A21 and A22 according to a state (on/off) of the first switch circuit SWL, a state (on/off) of the third switch circuit SWM, and the second input signal. The second control circuit FBN2 controls gains of the output amplifiers A21 and A22 such that a differential gain of the second BTL amplifier B2 is a prescribed value.

The second control circuit FBN2 has a control loop for, during the small signal mode, controlling a common mode voltage to fix output potential of the output amplifier A22, which is a reference output, to approximately VDD/2 and equalize output currents of the output amplifiers A22 and A41.

The second control circuit FBN2 has a control loop for, during the medium signal mode, controlling a common mode voltage to fix the output potential of the output amplifier A21, which is the reference output, to approximately VDD/2 and equalize output currents of the output amplifiers A12 and A21.

Further, the second control circuit FBN2 controls output potentials of the output amplifiers A21 and A22 immediately before turn-off of the first switch circuit SWL to be maintained as a common mode voltage unless an output of the output amplifier A21 is clipped when the first switch circuit SWL is off in the large signal mode.

When the second input signal is null, the second control circuit FBN2 sets direct-current voltages at the output terminals TA21 and TA22 of the second BTL amplifier B2 to VDD/2.

The third control circuit FBN3 controls outputs of the output amplifiers A31 and A32 according to a state (on/off) of the second switch circuit SWR, a state (on/off) of the third switch circuit SWM, and the third input signal. The third control circuit FBN3 controls gains of the output amplifiers A31 and A32 such that a differential gain of the third BTL amplifier B3 is a prescribed value.

The third control circuit FBN3 has a control loop for, during the small signal mode, controlling a common mode voltage to supply output potential of the output amplifier A31, which is a reference output, to output potential of the output amplifier A42 via the second switch circuit SWR and equalize output currents of the output amplifiers A31 and A42.

The third control circuit FBN3 has a control loop for, during the medium signal mode, controlling a common mode voltage to fix the output potential of the output amplifier A31, which is the reference output, to approximately VDD/2 and equalize output currents of the output amplifiers A31 and A42. That is, the third control circuit FBN3 controls the output amplifiers A31 and A42 to operate as parallel amplifiers when the second switch circuit SWR is on.

Further, the third control circuit FBN3 controls output potentials of the output amplifiers A31 and A32 immediately before turn-off of the second switch circuit SWR to be retained as a common mode voltage unless an output of the output amplifier A31 is clipped when the second switch circuit SWR is off in the large signal mode. When the third input signal is null, the third control circuit FBN3 sets direct-current voltages at the output terminals TA32 and TA41 to VDD/2.

The fourth control circuit FBN4 controls outputs of the output amplifiers A41 and A42 according to a state (on/off) of the second switch circuit SWR, a state (on/off) of the third switch circuit SWM, and the fourth input signal. The fourth control circuit FBN4 controls gains of the output amplifiers A41 and A42 such that a differential gain of the fourth BTL amplifier B4 is a prescribed value.

The fourth control circuit FBN4 has a control loop for, during the small signal mode, controlling a common mode voltage to fix output potential of one output amplifier A41, which is a reference output, to approximately VDD/2 and equalize output currents of the output amplifiers A22 and A41.

The fourth control circuit FBN4 has a control loop for, during the medium signal mode, controlling a common mode voltage to fix output potential of the output amplifier A41, which is a reference output, to approximately ADD/2 and equalize output currents of the output amplifiers A22 and A41, which form a pair.

Further, the fourth control circuit FBN4 controls output potentials of the output amplifiers A41 and A42 immediately before turn-off of the second switch circuit SWR to be retained as a common mode voltage unless an output of the output amplifier A42 is clipped when the second switch circuit SWR is off in the large signal mode. When the fourth input signal is null, the fourth control circuit FBN4 sets direct-current voltages at the output terminals TA41 and TA42 to VDD/2.

Figure 2:
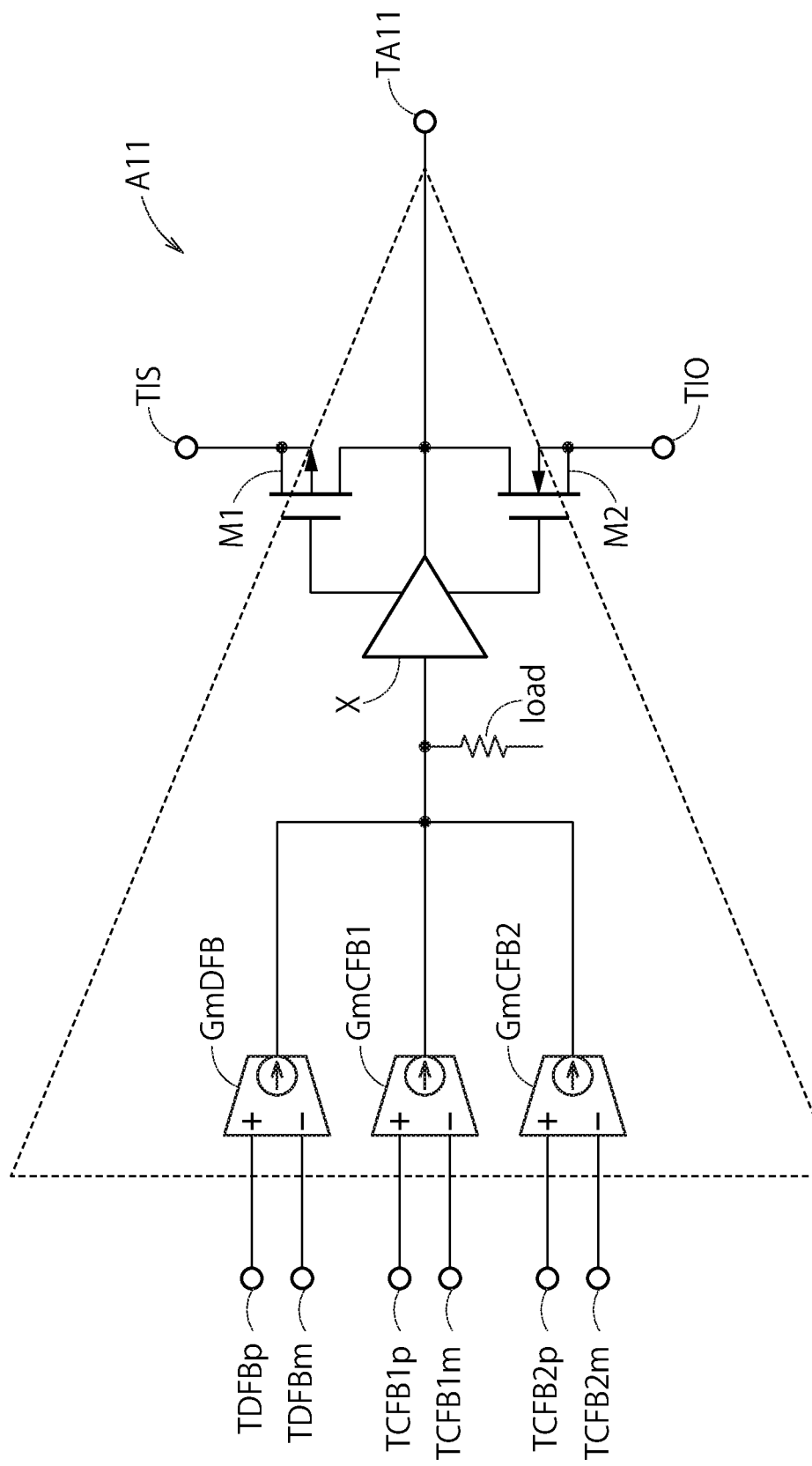
FIG. 2 is a diagram showing an example of the configuration of a first output amplifier A11 shown in FIG. 1.

FIG. 2 is a configuration diagram showing an example of the output amplifier A11. The other output amplifiers A12 to A42 have the same configuration. The output amplifier A11 shown in FIG. 2 includes differential input transconductance (gm) circuits GmDFB, GmCFB1, and GmCFB2, an internal load load, a driver X, and a pMOS transistor M1 and an nMOS transistor M2 of a complementary type.

One end (a source) of a current path of the transistor M1 is connected to a current supply terminal TIS and the other end (a drain) of the current path is connected to an output terminal TA11. One end (a drain) of a current path of the transistor M2 is connected to the output terminal TA11 and the other end (a source) of the current path is connected to a current sweep-out terminal TIO. Current supply is performed to the output terminal TA11 from the current supply terminal TIS. An electric current flows from the output terminal TA11 to the current sweep-out terminal TIO.

The gm circuit GmDFB outputs an electric current according to the potential difference between a first positive-phase input TDFBp and a first reverse-phase input TDFBm. The gm circuit GmCFB1 outputs an electric current according to the potential difference between a second positive-phase input TCFB1p and a second reverse-phase input TCFB1m. The gm circuit GmCFB2 outputs an electric current according to the potential difference between a third positive-phase input TCFB2p and a third reverse-phase input TCFB2m.

It is assumed that gms (transconductances) of the three gm circuits GmDFB, GmCFB1, and GmCFB2 are set to any values. Outputs of the gm circuits GmDFB, GmCFG1, and GmCFB2 are combined to drive the internal load load. An I-V converted output is further amplified by the driver X. The transistors M1 and M2, which have a push-pull configuration, are driven by an output of the driver X. Therefore, the transistors M1 and M2 are controlled by the gm circuits GmDFB, GmCFB1, and GmCFB2 to determine a voltage at the output terminal TA11.

In this embodiment, when the potential at a positive-phase input terminal is higher than the potential at a reverse-phase input terminal, the gm circuits operate to amplify the voltage at the output terminal to the positive-phase side. However, if the potential at a reverse-phase input of the gm circuits GmDFB, GmCFB1, and GmCFB2 is higher than the potential at a positive-phase input thereof, for example, the voltage at the load load is determined by a sum of output currents of the gm circuits.

If the voltage at the load load is amplified to the positive phase, the potential at the output terminal TA11 is also amplified to the positive phase. If the voltage at the load load is amplified to the reverse phase, the potential at the output terminal TA11 is also amplified to the reverse phase. That is, the output amplifier A11 controls the transistors M1 and M2 to be turned on or off in a complementary manner according to the potential difference between the first positive-phase input TDFBp and the first reverse-phase input TDFBm, the potential difference between the second positive-phase input TCFB1p and the second reverse-phase input TCFB1m, and the potential difference between the third positive-phase input TCFB2p and the third reverse-phase input TCFB2m.

Figure 3:
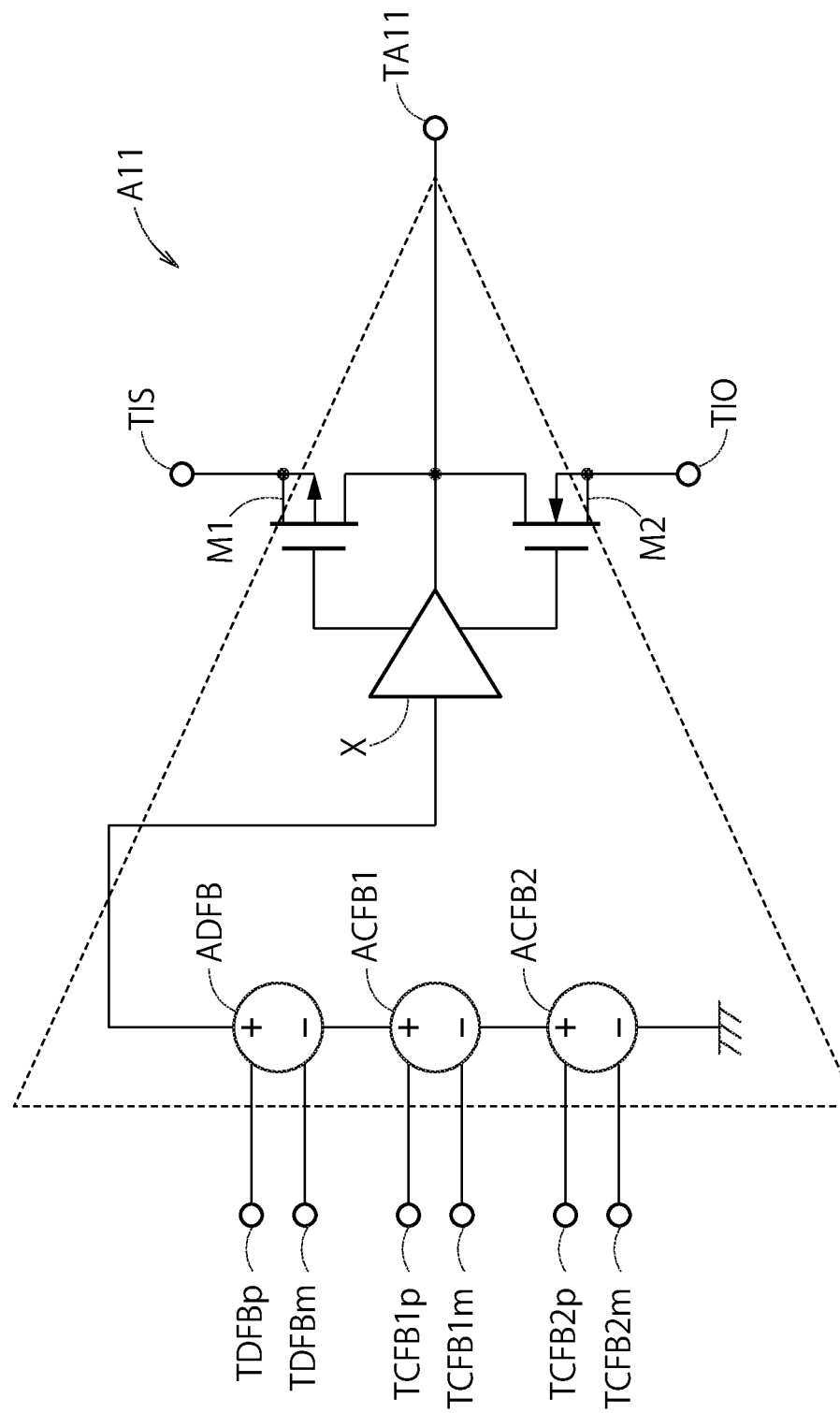
FIG. 3 is a diagram showing another example of the configuration of the first output amplifier A11 shown in FIG. 1.

FIG. 3 is a configuration diagram showing another example of the output amplifier A11. The other output amplifiers A12 to A42 have the same configuration. The first output amplifier A11 includes differential input voltage controlled voltage source (vcvs) circuits ADFB, ACFB1, and ACFB2, the driver X, and the pMOS transistor M1 and the nMOS transistor M2 of a complementary type.

One end (a source) of a current path of the transistor M1 is connected to the current supply terminal TIS. The other end (a drain) of the current path is connected to the output terminal TA11. One end (a drain) of a current path of the transistor M2 is connected to the output terminal TA11. The other end (a source) of the current path is connected to the current sweep-out terminal TIO.

The voltage controlled voltage source circuit ADFB outputs a voltage according to the potential difference between the first positive-phase input TDFBp and the first reverse-phase input TDFBm. The voltage controlled voltage source circuit ACFB1 outputs a voltage according to the potential difference between the second positive-phase input TCFB1p and the second reverse-phase input TCFB1m. The voltage controlled voltage source circuit ACFB2 outputs a voltage according to the potential difference between the third positive-phase input TCFB2p and the third reverse-phase input TCFB2m. Amplification factors of the voltage controlled voltage source circuits ADFB, ACFB1, and ACFB2 are set to any values. Outputs of the voltage controlled voltage source circuits ADFB, ACFB1, and ACFB2 are added up and further amplified by the driver X.

If the potential at the positive-phase input terminal is higher than the potential at the reverse-phase input terminal, the voltage controlled voltage source circuit is amplified to the positive phase. If an added-up output of the voltage controlled voltage source circuits ADFB, ACFB1, and ACFB2 has a positive phase, the voltage controlled voltage source circuits ADFB, ACFB1, and ACFB2 operate to amplify the output terminal to the positive-phase side.

That is, the first output amplifier A11 controls the transistors M1 and M2 to be turned on or off in a complementary manner according to the potential difference between first positive-phase input TDFBp and the first reverse-phase input TDFBm, the potential difference between the second positive-phase input TCFB1p and the second reverse-phase input TCFB1m, and the potential difference between the third positive-phase input TCFB2p and the third reverse-phase input TCFB2m.

Only while the first switch circuit SWL is on, outputs of the output amplifiers A12 and A21 are set to reference potential VREF if gates of the transistors M1 of the output amplifiers A12 and A21 are short-circuited and gates of the transistors M2 of the output amplifiers A12 and A21 are short-circuited. Therefore, it is possible to control output currents of the output amplifiers A12 and A21 to be equal.

Similarly, only while the second switch circuit SWR is on, outputs of the output amplifiers A31 and A42 are set to the reference potential VREF if gates of the transistors M1 of the output amplifiers A31 and A42 are short-circuited and gates of the transistors M2 of the output amplifiers A31 and A42 are short-circuited. Therefore, it is possible to control output currents of the output amplifiers A31 and A42 to be equal.

Similarly, only while the third switch circuit SWM is on, outputs of the output amplifiers A22 and A41 are set to the reference potential VREF if gates of the transistors M1 of the output amplifiers A22 and A41 are short-circuited and gates of the transistors M2 of the output amplifiers A22 and A41 are short-circuited. Therefore, it is possible to control output currents of the output amplifiers A22 and A41 to be equal.

Figure 4:
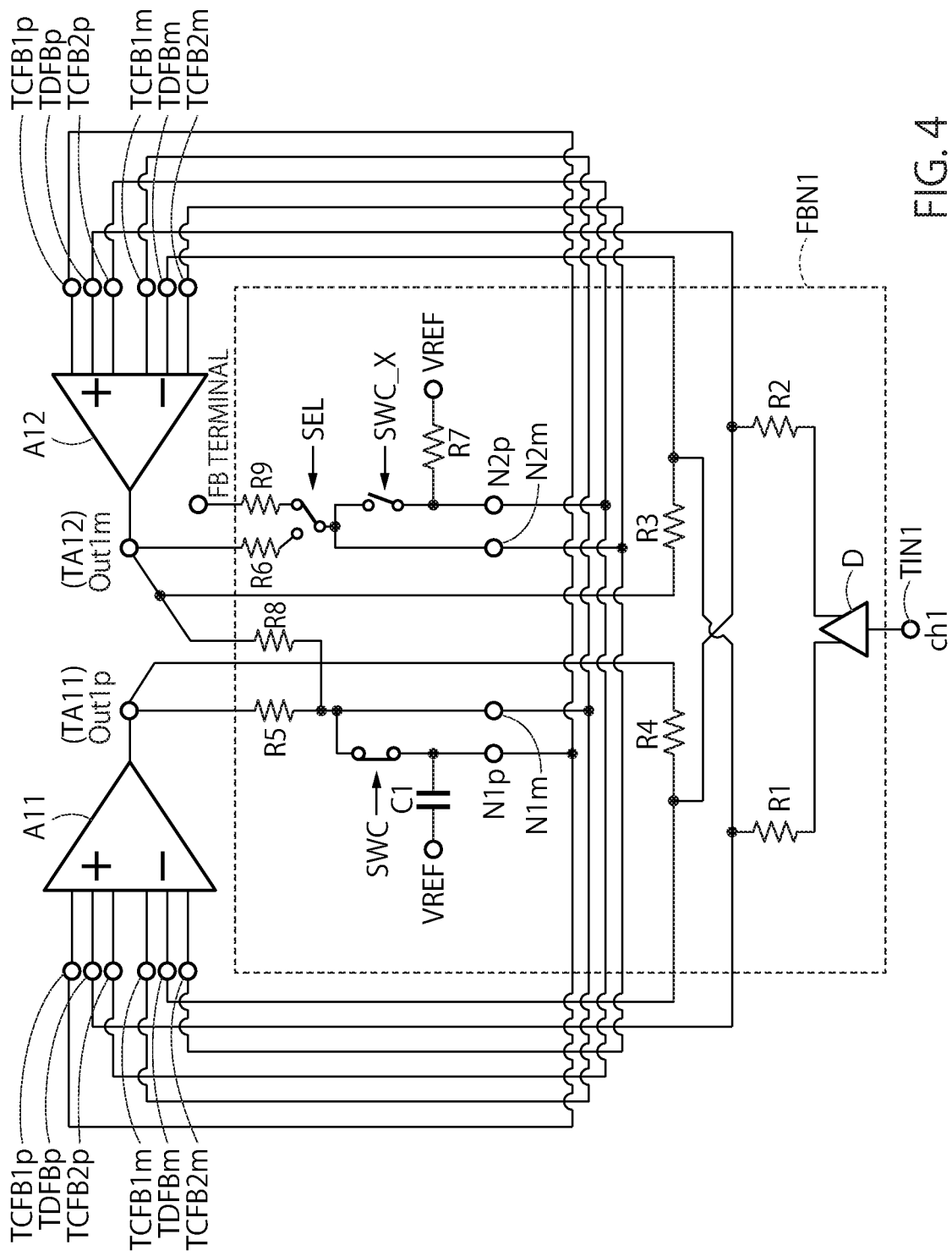
FIG. 4 is a diagram showing an example of the configuration of a first control circuit FBN1 shown in FIG. 1.

FIG. 4 is a configuration diagram showing an example of the first control circuit FBN1. The second to fourth control circuits FBN2 to FBN4 have the same configuration. The first control circuit FBN1 shown in FIG. 4 includes a differential output circuit D, resistors R1 to R9, a first control switch SWC, a second control switch SWC_X, a selection circuit SEL, and a capacitor C1.

A first input signal is input to an input of the differential output circuit D. The differential output circuit D outputs a differential signal based on the first input signal from a first output and a second output. The first output is connected to the first positive-phase input TDFBp of the output amplifier A11 and the first reverse-phase input TDFBm of the output amplifier A12 via the resistor R1 and connected to the output terminal TA12 via the resistors R1 and R3. The second output is connected to the first reverse-phase input TDFBm of the output amplifier A11 and the first positive-phase input TDFBp of the output amplifier A12 via the resistor R2 and connected to the output terminal TA11 via the resistors R2 and R4.

One end of the first control switch SWC is connected to the second reverse-phase input TCFB1m of the output amplifier A11 and connected to the output terminal TA11 via the resistor R5. The other end of the first control switch SWC is connected to the second positive-phase inputs TCFB1p of the output amplifiers A11 and A12. The reference voltage VREF is supplied to the other end of the first control switch SWC via the capacitor C1. The first control switch SWC is turned on or off in synchronization with the first switch circuit SWL.

One end the second control switch SWC_X is connected to the selection circuit SEL and the third reverse-phase inputs TCFB2m of the output amplifiers A11 and A12. The other end of the second control switch SWC_X is connected to the third positive-phase inputs TCFB2p of the output amplifiers A11 and A12. The second control switch SWC_X is turned on or off complementarily to the first control switch SWC.

One of control loops, that is, a differential feedback loop defined by the resistors R1 to R4 always functions. The differential feedback loop controls the potential difference between the first positive-phase input TDFBp and the first reverse-phase input TDFBm to always maintain a gain of a voltage between the terminal TIN1 and the output terminals TA11 and TA12 substantially constant.

One end of the selection circuit SEL is connected to the third reverse-phase inputs TCFB2m of the output amplifiers A11 and A12. The other end of the selection circuit SEL is connected to the output terminal TA12 via the resistor R6 or connected to the feedback terminal FB via the resistor R9 in synchronization with the third switch circuit SWM according to a control signal. That is, the selection circuit SEL selects the resistor R9 when the switch circuit SWM is on and selects the resistor R6 when the switch circuit SWM is off.

A feedback control loop defined by the resistors R5 and R8, the capacitor C1, and the reference voltage VREF controls the potential difference between the second positive-phase input TCFB1p and the second reverse-phase input TCFB1m. The resistor R5 may detect a common mode voltage of the output terminals TA11 and TA12 using the same value as the resistor R8 or detect the voltage at the output terminal TA11 assuming that the resistor R5<<the resistor R8.

A feedback control loop defined by the resistors R6, R7, and R9 and the reference voltage VREF controls the potential difference between the third positive-phase input TCFB2p and the third reverse-phase input TCFB2m.

The potential difference between a node N1p and a node N1m is zero in a period in which the first control switch SWC is on (a period in which the second control switch SWC_X is off). In this period, the capacitor C1 is charged such that the voltage at the node N1p is equal to a partial voltage of the voltage between the output terminals TA11 and TA12. The charging to the capacitor C1 is referred to as sample mode.

In this period, since the potential difference between the node N1p and the node N1m is zero, the output current of the gm circuit GmCFB1 shown in FIG. 2 is zero. The gm circuit GmCFB1 does not contribute to the amplifying operation of the output amplifiers. Further, in this period, since the second control switch SWC_X is off, the gm circuit GmCFB2 is in a controlled state. The reference voltage VREF is supplied to the third positive-phase inputs TCFB2p of the output amplifiers A11 and A12 via the resistor R7.

When the selection circuit SEL is selecting the resistor R9, the voltage at the output terminal TA22 is supplied to the third reverse-phase inputs TCFB2m of the output amplifiers A11 and A12. Consequently, a control loop for the third positive-phase input TCFB2p and the third reverse-phase input TCFB2m operates to equalize the voltage at the output terminal TA12 to the voltage at the output terminal TA21 and equalize the voltage at the output terminal TA22 to the reference voltage VREF. (the small signal mode).

When the selection circuit SEL is selecting the resistor R6, the voltage at the output terminal TA12 is supplied to the third reverse-phase input TCFB2m. Consequently, the control loop for the third positive-phase input TCFB2p and the third reverse-phase input TCFB2m operates to equalize the voltage at the output terminal TA12 to the reference voltage VREF (the medium signal mode).

That is, when the first switch circuit SWL is on (the first control switch SWC is on and the second control switch SWC_X is off) and the third switch circuit SWM is on (the selection circuit SEL is selecting the resistor R9), the first and second control circuits FBN1 and FBN2 set the output terminal TA22 to the reference potential VREF. When the first switch circuit SWL is on and the third switch circuit SWM is off (the selection circuit SEL is selecting the resistor R6), the first control circuit FBN1 sets the output terminal TA12 to the reference potential VREF.

The potential difference between a node N2p and a node N2m is zero in a period in which the first control switch SWC is off (a period in which the second control switch SWC_X is on). Therefore, the output current of the gm circuit GmCFB2 is zero. The gm circuit GmCFB2 does not contribute to the amplifying operation of the output amplifiers. Since the first control switch SWC is turned off, electric charges stored in the capacitor C1 are retained. The retaining of the electric charges stored in the capacitor C1 is referred to as hold mode.

In the hold mode, the potential at the output terminal TA11 is referred to and supplied to the node N1m via the resistors R5 and R8 and the voltage retained in the capacitor C1 is supplied to the node N p. Therefore, a control loop for the second positive-phase input TCFB1p and the second reverse-phase input TCFB1m operates to equalize the common mode voltages at the output terminals TA11 and TA12 to a value immediately before turn-off of the first control switch SWC (the large signal mode).

The differential feedback loop is only a loop for fixing a differential gain and cannot determine direct-current voltages at the output terminals TA11 and TA12. Therefore, the determination of the direct-current voltages at the output terminals TA11 and TA12 is performed in the control loop for the third positive-phase input TCFB2p and the third reverse-phase input TCFB2m or the control loop for the second positive-phase input TCFB1p and the second reverse-phase input TCFB1m. The second to fourth control circuits FBN2 to FBN4 execute the same control operation.

Figure 5:
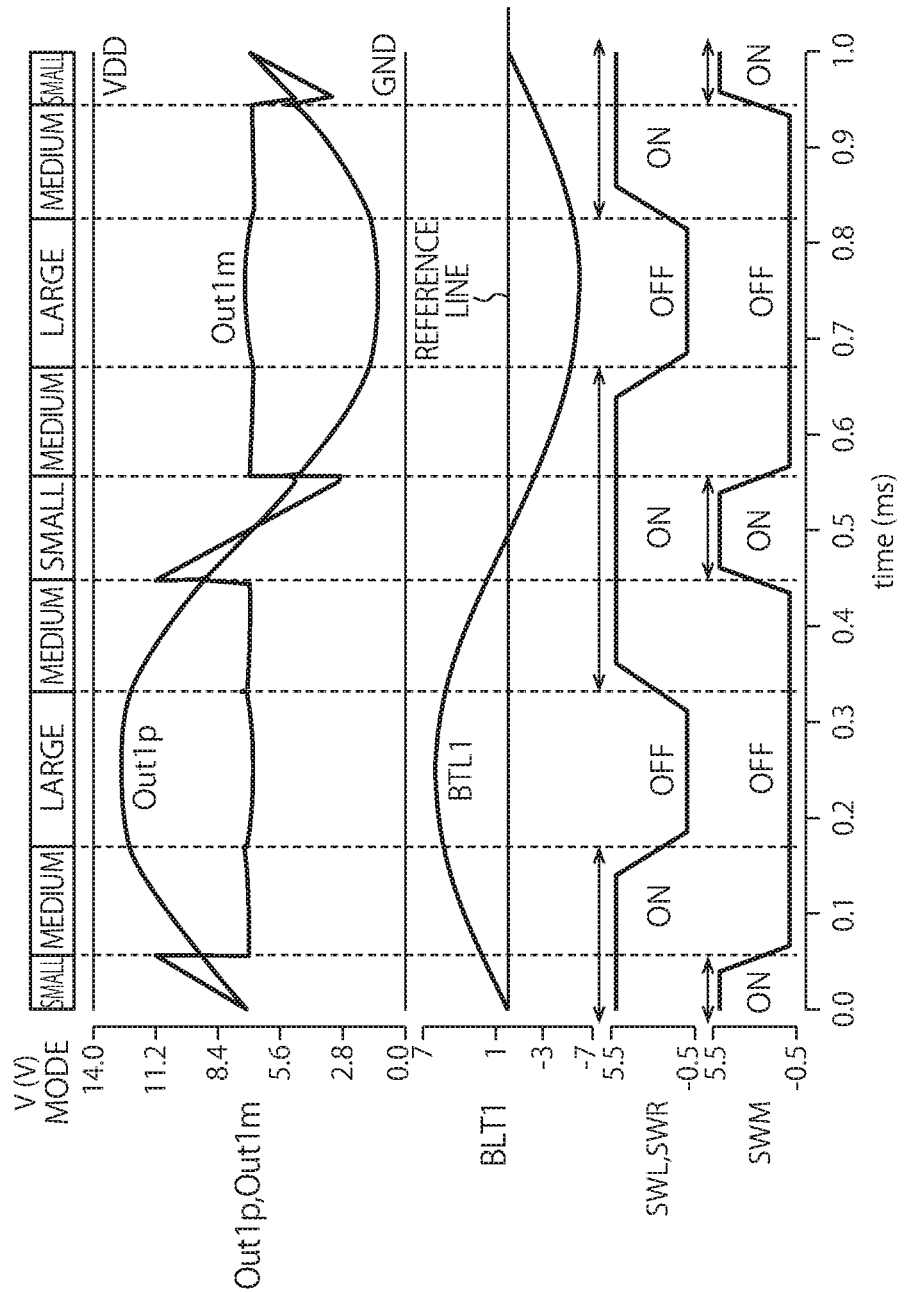
FIG. 5 is a diagram showing an example of a relation between output waveforms and modes of a BTL amplifier.

FIG. 5 is a diagram showing an example of relations between output waveforms and modes. The horizontal axis indicates time.

An upper stage in FIG. 5 shows waveforms of an Out1p voltage at the output terminal TA11 and an Out1m voltage at the output terminal TA12. The next stage indicates a differential waveform BTL1 between the Out1p voltage and the Out1m voltage. The next stage indicates an example of an ON state and an OFF state of the first switch circuit SWL and the second switch circuit SWR. The next stage indicates an example of an ON state and an OFF state of the third switch circuit SWM. The modes transition in the order of the small signal mode, the medium signal mode, and the large signal mode transition according to the amplitude of an input signal, which is the absolute value of a differential value between the differential waveform BTL1 and a reference line.

Figure 6:
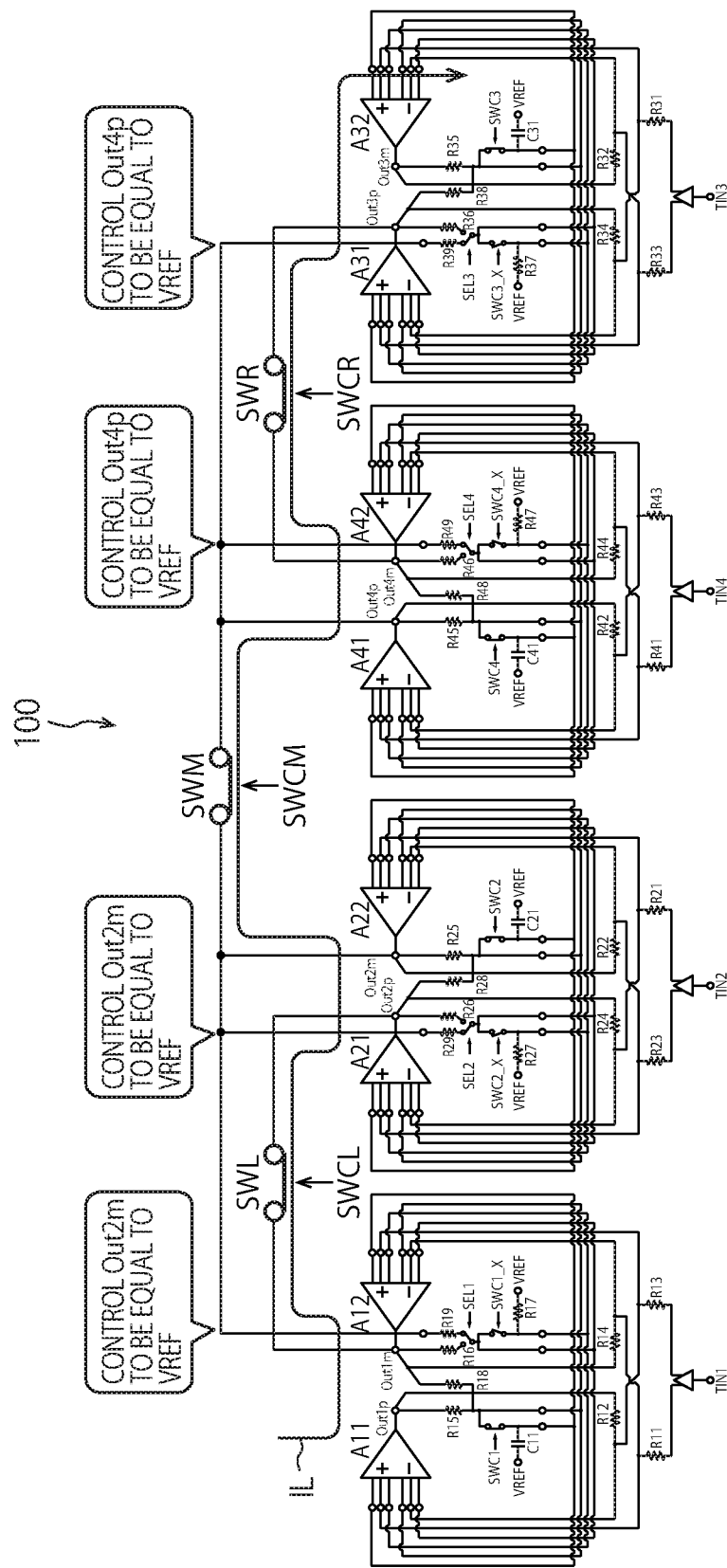
FIG. 6 is a diagram showing a driving state example in a small signal mode.
Figure 8:
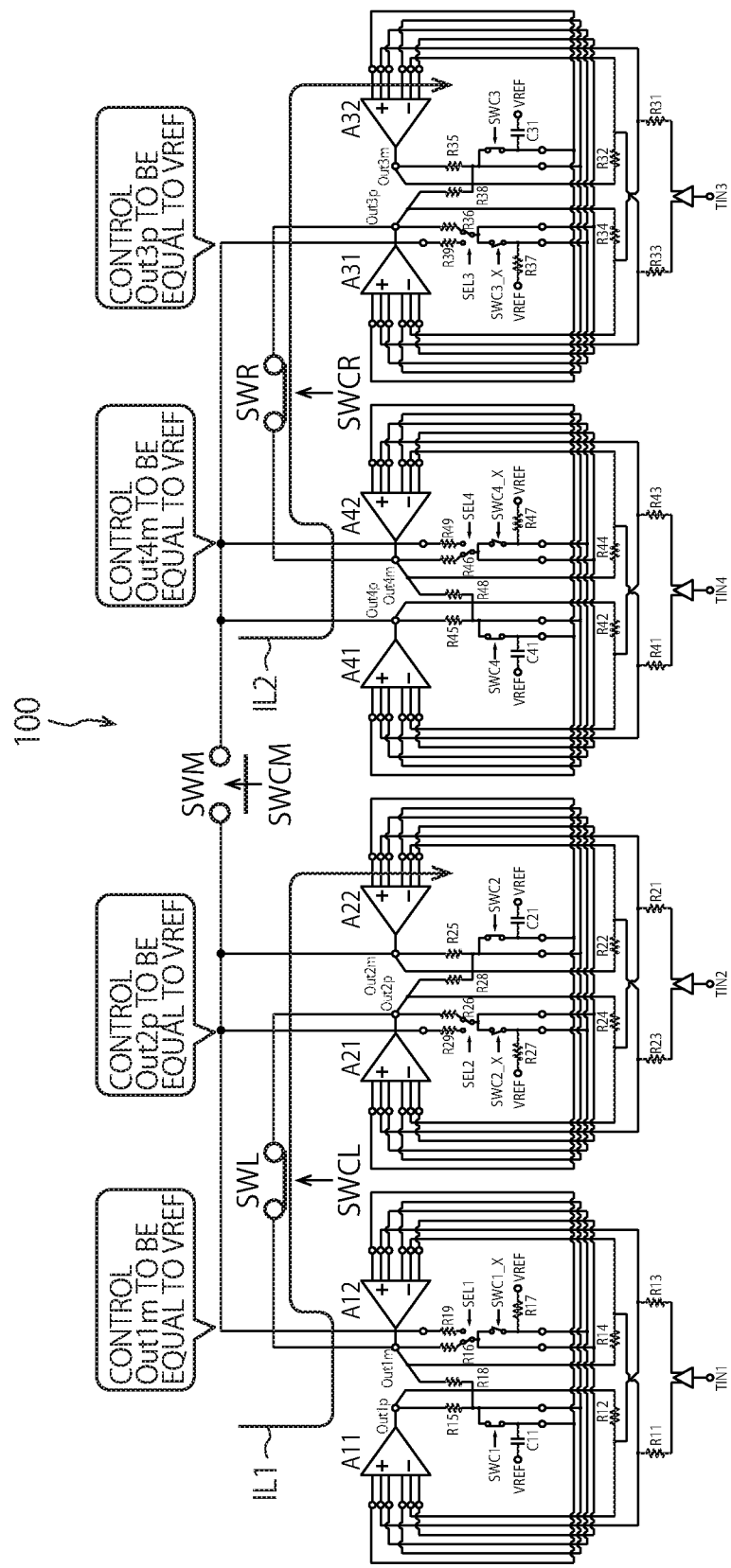
FIG. 8 is a diagram showing a driving state example in a medium signal mode.
Figure 10:
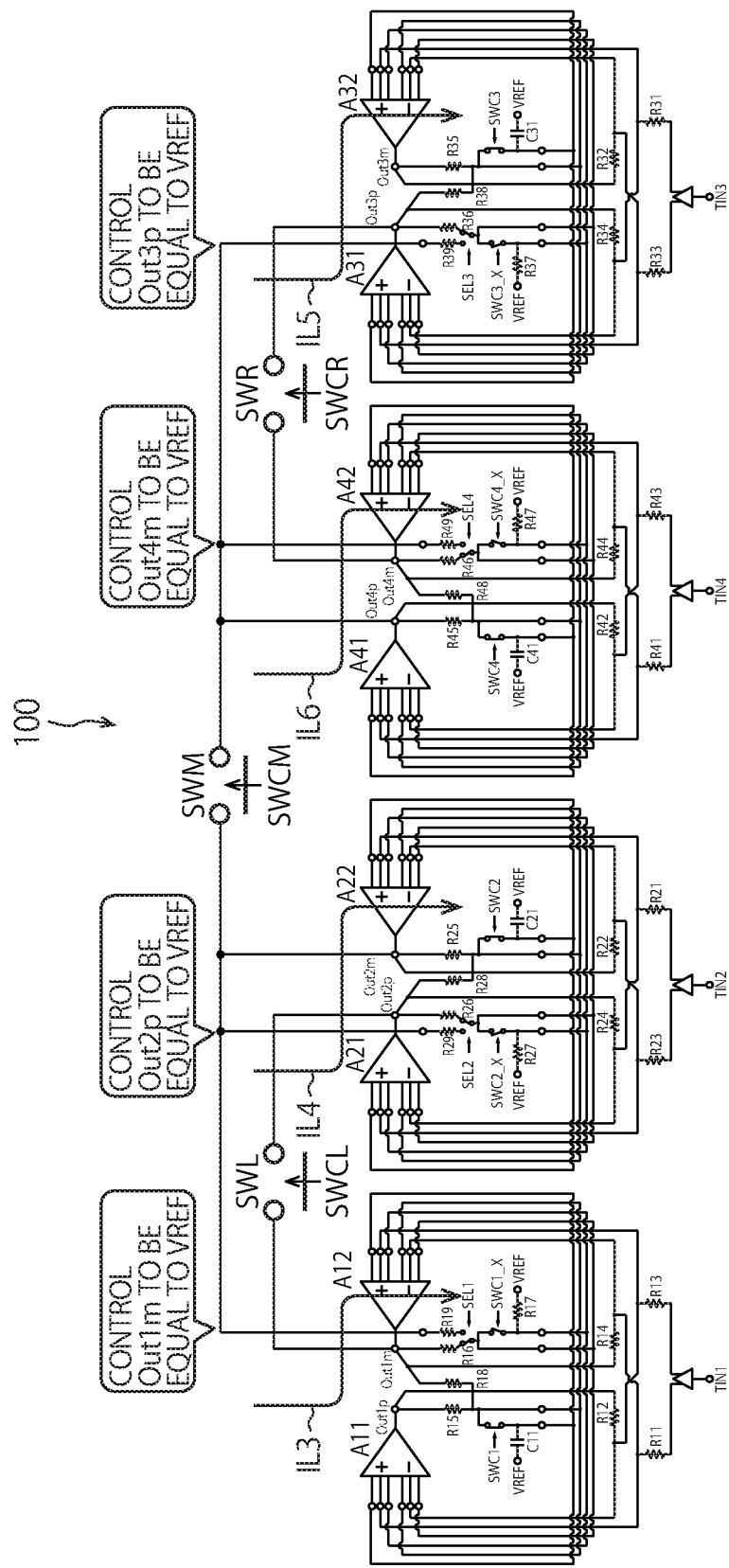
FIG. 10 is a diagram showing a driving state example in a large signal mode.

FIGS. 6, 8, and 10 are diagrams showing driving state examples in the modes of the audio system including the power amplifying device 100. Output signals at the output terminals TA11 to TA42 are indicated by Out1p, Out1m, Out2p, Out2m, Out3p, Out3m, Out4p, and Out4m.

Figure 7:
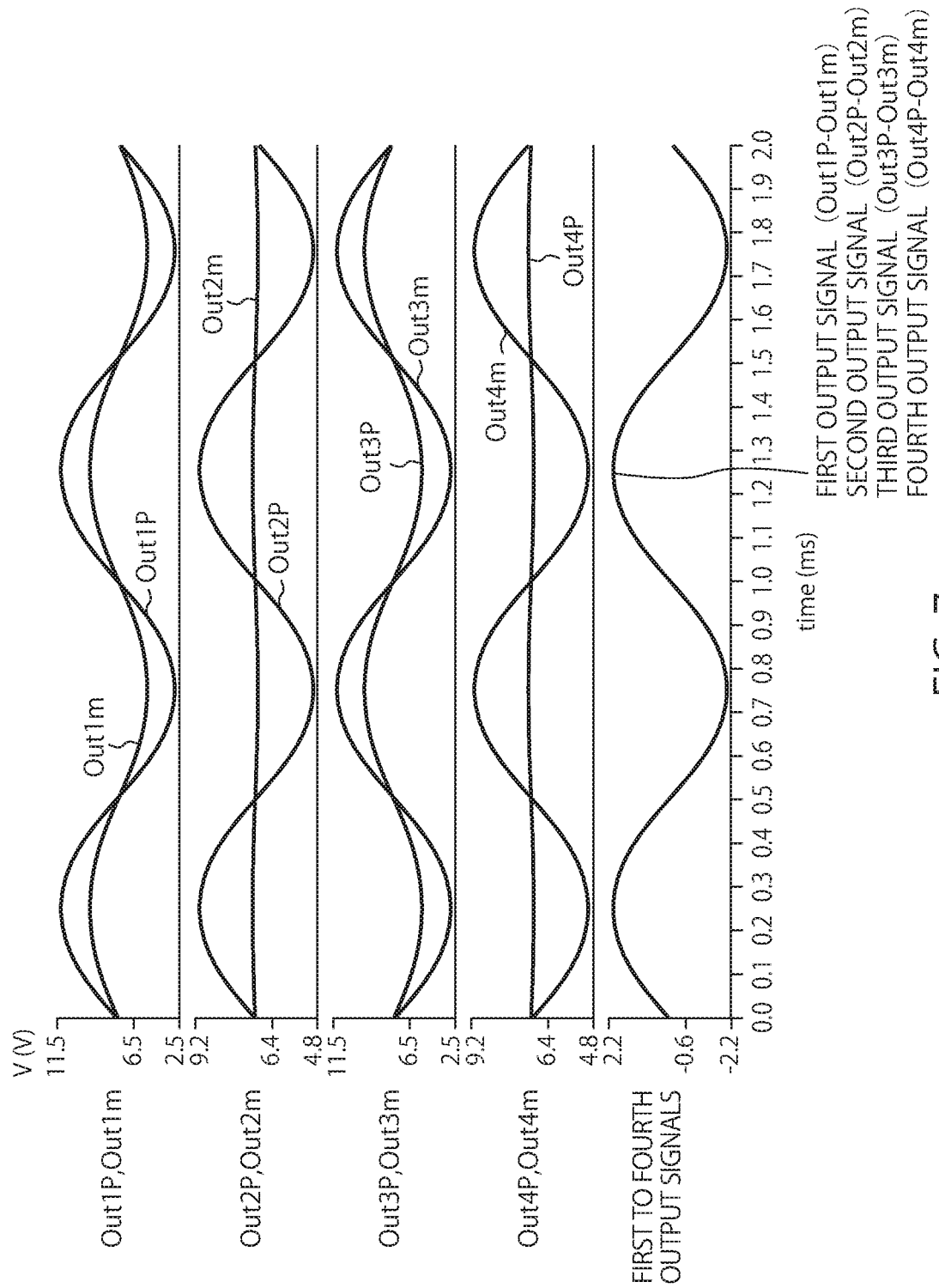
FIG. 7 is a diagram showing an output signal example in the small signal mode.
Figure 9:
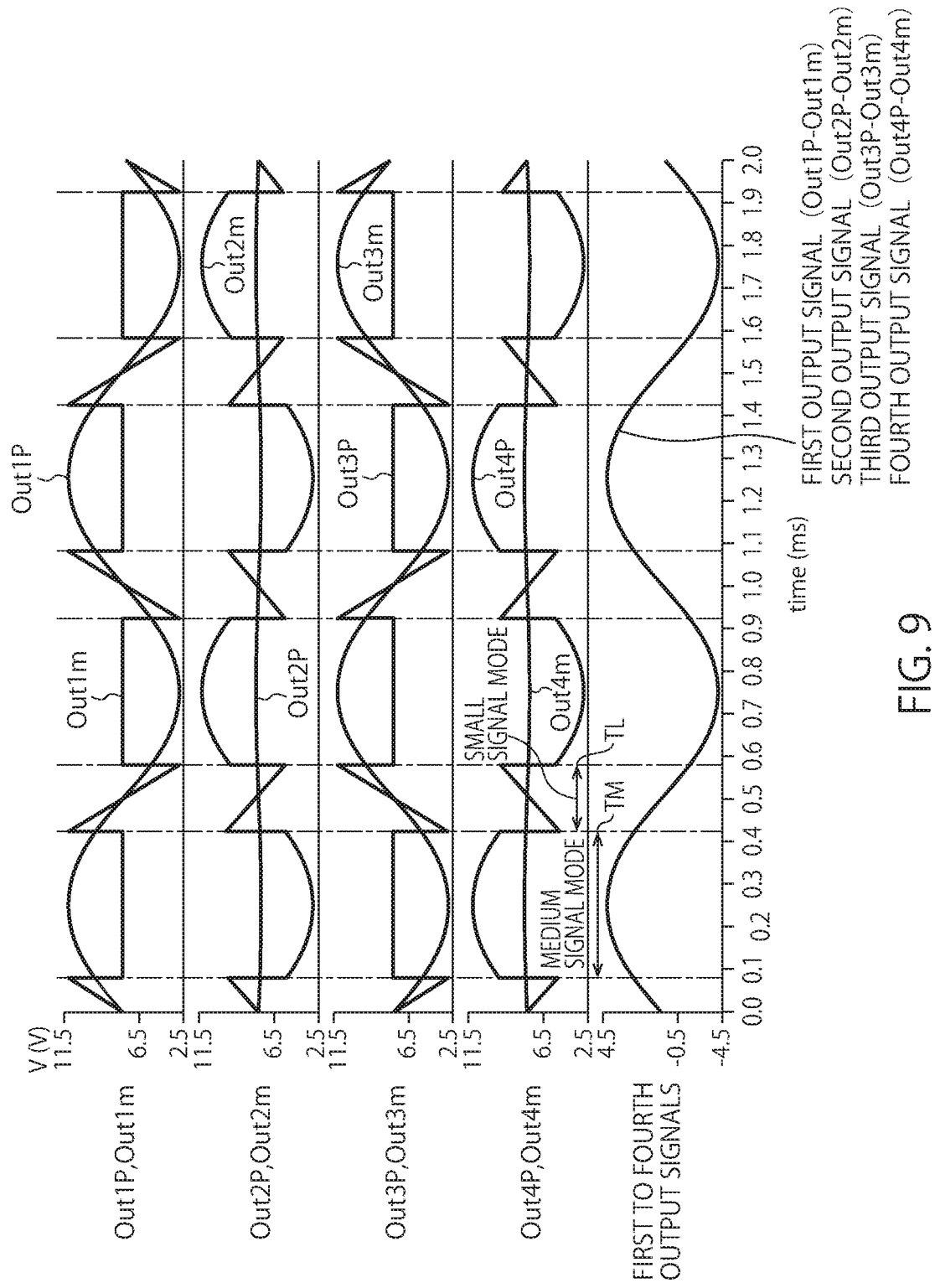
FIG. 9 is a diagram showing output signal examples in the small signal mode and the medium signal mode.
Figure 11:
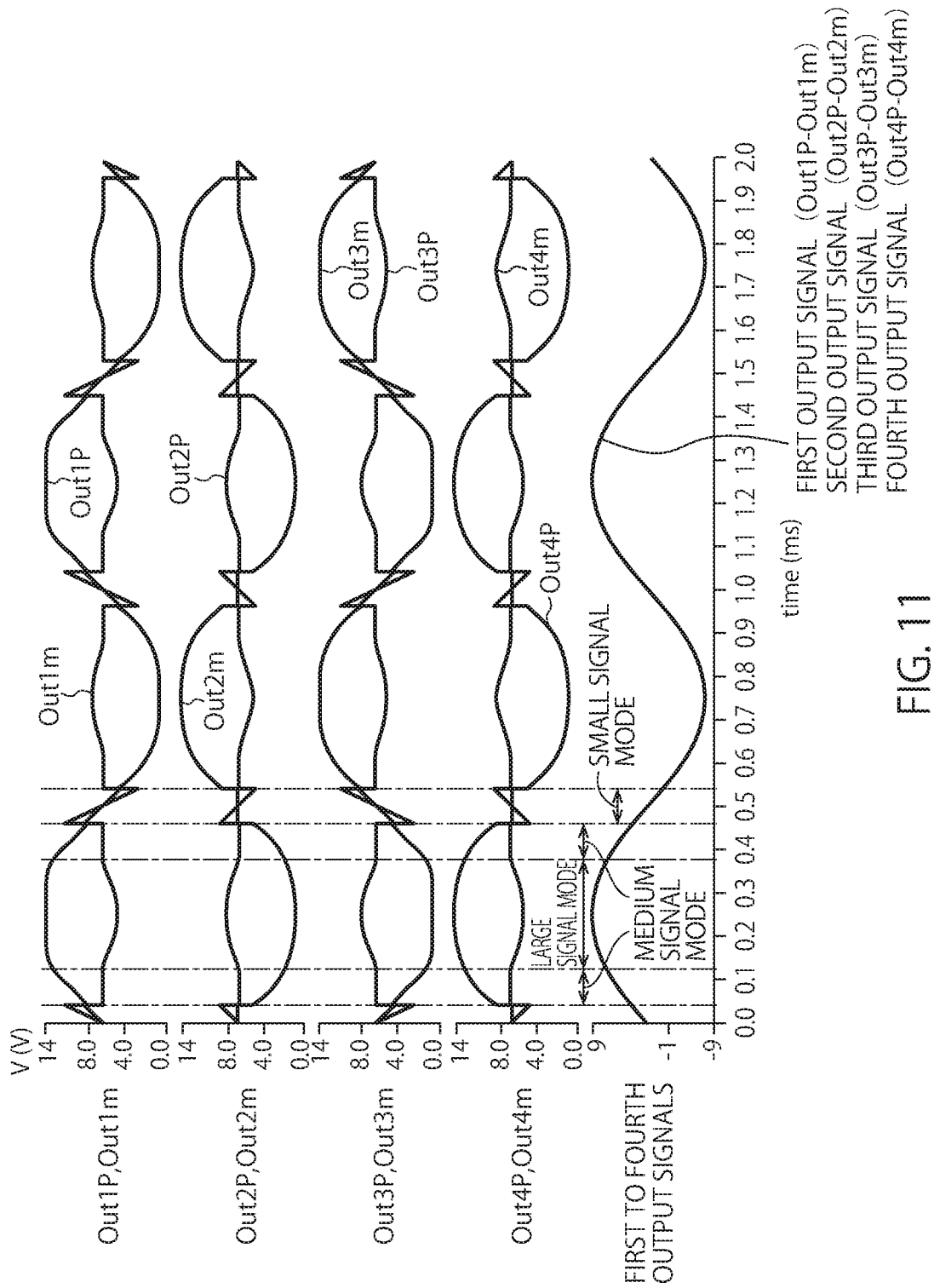
FIG. 11 is a diagram showing output signal examples in the small signal mode, the medium signal mode, and the large signal mode.

FIGS. 7, 9, and 11 are diagrams showing output signal examples in the modes of the power amplifying device 100. The horizontal axis indicates time and the vertical axis indicates a signal value as a voltage. VDD=14 volts. Output signals of the amplifiers, that is, first to fourth output signals in the first to fourth BTL amplifiers B1, B2, B3, and B4 are shown in order from the upper stage. A scale of the vertical axis is changed as appropriate.

FIGS. 6 and 7 are diagrams showing a driving state example and an output signal example in the small signal mode. During the small signal mode, since all of the first to third switch circuits SWL, SWR, and SWM are in an ON state, first control switches SWC1 to SWC4 of the control circuits are on, and the selection circuits SEL1 to SEL4 are selecting the resistor R9 side. On the other hand, second control switches SWC1_X to SWC4_X are off. Therefore, the potential of a power line of the third switch circuit SWM is set to the reference potential VREF.

Differential amplitude for setting a differential gain of the first BTL amplifier B1 to a prescribed value appears in the output signal Out1p of the output amplifier A11. The output signal Out1m of the output amplifier A12 has the same voltage as the voltage of the output signal Out2p because the first switch circuit SWL is on.

Differential amplitude for setting a differential gain of the second BTL amplifier B2 to a prescribed value appears in the output signal Out2p of the output amplifier A21. In the output signal Out2m of the output amplifier A22, the same potential is set in a first positive-phase terminal and a first reverse-phase terminal of the output amplifier A22 because the first control switch SWC2 is on. Since a potential difference is 0, an output current of the gm circuit GmCFB1 is 0 and does not contribute to the amplifying operation of the output amplifier A22.

At this time, since the second control switch SWC2_X is off, the gm circuit GmCFB2 is in a controlled state. That is, the output signal Out2m is supplied to the third reverse-phase input TCFB2m via a resistor R29 and the reference voltage VREF is supplied to the third positive-phase input TCFB2p via a resistor R27. The control loop for the third positive-phase input TCFB2p and the third reverse-phase input TCFB2m operates to equalize the output signal Out2m to the reference voltage VREF. That is, in the small signal mode, the second control circuit FBN2 sets an output of the output amplifier A22 to the reference potential VREF.

The output signal Out3p of the output amplifier A31 has the same voltage as the voltage of the output signal Out4m because the second switch circuit SWR is on. Differential amplitude for setting a differential gain of the third BTL amplifier B3 to a prescribed value appears in the output signal Out3m of the output amplifier A32.

Differential amplitude for setting a differential gain of the fourth BTL amplifier B4 to a prescribed value appears in the output signal Out4m of the output amplifier A42. In the output signal Out4p of the output amplifier A41, the same potential is set in a first positive-phase terminal and a first reverse-phase terminal of the output amplifier A41 because the first control switch SWC4 is on. Since a potential difference is 0, an output current of the gm circuit GmCFB1 is 0 and does not contribute to the amplifying operation of the output amplifier A41.

At this time, since the second control switch SWC4_X is off, the gm circuit GmCFB2 is in a controlled state. That is, the output signal Out4p is supplied to the third reverse-phase input TCFB2m via a resistor R49 and the reference voltage VREF is supplied to the third positive-phase input TCFB2p via a resistor R47. Consequently, the control loop for the third positive-phase input TCFB2p and the third reverse-phase input TCFB2m operates to equalize the output signal Out4p to the reference voltage VREF. That is, in the small signal mode, the fourth control circuit FBN4 sets an output of the output amplifier A41 to the reference potential VREF.

An electric current IL used in the load (the speaker S1) of the first channel Ch1 is used in the load (the speaker S2) of the second channel Ch2 via the first switch circuit SWL. Subsequently, the electric current IL is used in the load (the speaker S4) of the fourth channel Ch4 via the third switch circuit SWM and used in the load (the speaker S3) of the third channel Ch3 via the second switch circuit SWR.

Power efficiency in the small signal mode is explained. Input power P1ch for each one channel is indicated by Expression (1). A power supply voltage is represented as VDD, maximum amplitude of a signal voltage is represented as VO, and load resistance is represented as RL.

$$P1ch = VDD \times IL = \frac{2VDD \cdot VO}{\pi RL} \qquad (1)$$

Output power P0, 1ch for each one channel is indicated by Expression (2). Power consumption PD1 for each one channel is indicated by Expression (3).

$$P0, 1ch = \frac{VO^2}{2RL} \qquad (2)$$

$$PD1 = P1ch - P0, 1ch \qquad (3)$$

Consequently, power consumption PD4 for four channels is indicated by Expression (4).

$$PD4 = (P1ch - P0, 1ch) \times 4 \qquad (4)$$

Consumption efficiency η is indicated by Expression (5).

$$\eta = PD4/P1ch \qquad (5)$$

For example, when VDD=14.4 volts, RL=4 ohms, and amplitude VO=2.828, the consumption efficiency η is 0.617.

On the other hand, in the conventional AB-class, since an electric current is consumed for each channel, entire input power is four times as large as that of P1ch. The conventional AB-class consumption efficiency η is indicated by Expression (6).

$$\eta = PD4/(P1ch \times 4) \qquad (6)$$

For example, when VDD=14.4 volts, RL=4 ohms, and amplitude VO=2.828, the conventional consumption efficiency ti is 0.154. In the small signal mode in this embodiment, the consumption efficiency η is improved to approximately four times by sharing an electric current among the loads. The consumption efficiency η is further improved as the number of loads to which the electric current IL is supplied increases.

FIG. 8 is a diagram showing a driving state example in the medium signal mode. FIG. 9 is a diagram showing an output signal example in the small signal mode and the medium signal mode. The medium signal mode is in a period of an arrow TM. The small signal mode is in a period of an arrow TL. During the medium signal mode, the first and second switch circuits SWL and SWR are in an ON state and the third switch circuit SWM is in an OFF state. The first control switches SWC1 to SWC4 are on. The selection circuits SEL1 to SEL4 are selecting the resistor R6 side. On the other hand, the second control switches SWC1_X to SWC4_X are off.

Output signals during the medium signal mode are explained. Differential amplitude for setting a differential gain of the first BTL amplifier B1 to a prescribed value appears in the output signal Out1$p$ of the output amplifier A11. In the output signal Out1$m$ of the output amplifier A12, the same potential is set in a first positive-phase terminal and a first reverse-phase terminal of the output amplifier A12 because the first control switch SWC1 is on. Since a potential difference is 0, an output current of the gm circuit GmCFB1 is 0 and does not contribute to the amplifying operation of the output amplifier A12.

At this time, since the second control switch SWC1_X is off, the gm circuit GmCFB2 is in a controlled state. That is, the output signal Out1$m$ is supplied to the third reverse-phase input TCFB2$m$ via a resistor R16 and the reference voltage VREF is supplied to the third positive-phase input TCFB2$p$ via a resistor R17. Consequently, as indicated by Out1$m$ in the medium signal mode in FIG. 9, the control loop for the third positive-phase input TCFB2$p$ and the third reverse-phase input TCFB2$m$ operates to equalize the output signal Out1$m$ to the reference voltage VREF.

Differential amplitude for setting a differential gain of the second BTL amplifier B2 to a prescribed value appears in the output signal Out2$m$ of the output amplifier A22. In the output signal Out2$p$ of the output amplifier A21, the same potential is set in a first positive-phase terminal and a first reverse-phase terminal of the output amplifier A21 because the first control switch SWC2 is on. Since a potential difference is 0, an output current of the gm circuit GmCFB1 is 0 and does not contribute to the amplifying operation of the output amplifier A21.

At this time, since the second control switch SWC2_X is off, the gm circuit GmCFB2 is in a controlled state. That is, the output signal Out2$p$ is supplied to the third reverse-phase input TCFB2$m$ via a resistor R26 and the reference voltage VREF is supplied to the third positive-phase input TCFB2$p$ via a resistor R27. Consequently, as indicated by Out2$p$ in the medium signal mode in FIG. 9, the control loop for the third positive-phase input TCFB2$p$ and the third reverse-phase input TCFB2$m$ operates to equalize the output signal Out2$p$ to the reference voltage VREF.

Differential amplitude for setting a differential gain of the third BTL amplifier B3 to a prescribed value appears in the output signal Out3$m$ of the output amplifier A32. When focusing on the output signal Out3$p$ of the output amplifier A31, the same potential is set in a first positive-phase terminal and a first reverse-phase terminal of the output amplifier A31 because the first control switch SWC3 is on. Since a potential difference is 0, an output current of the gm circuit GmCFB1 is 0 and does not contribute to the amplifying operation of the output amplifier A31.

At this time, since the second control switch SWC3_X is off, the gm circuit GmCFB2 is in a controlled state. That is, the output signal Out3$p$ is supplied to the third reverse-phase input TCFB2$m$ via a resistor R36 and the reference voltage VREF is supplied to the third positive-phase input TCFB2$p$ via a resistor R37. Consequently, as indicated by Out3$p$ in the medium signal mode in FIG. 9, the control loop for the third positive-phase input TCFB2$p$ and the third reverse-phase input TCFB2$m$ operates to equalize the output signal Out3$p$ to the reference voltage VREF.

Differential amplitude for setting a differential gain of the fourth BTL amplifier B4 to a prescribed value appears in the output signal Out4$p$ of the output amplifier A41. In the output signal Out4$m$ of the output amplifier A42, the same potential is set in a first positive-phase terminal and a first reverse-phase terminal of the output amplifier A42 because the first control switch SWC4 is on. Since a potential difference is 0, an output current of the gm circuit GmCFB1 is 0 and does not contribute to the amplifying operation of the output amplifier A42.

At this time, since the second control switch SWC4_X is off, the gm circuit GmCFB2 is in a controlled state. That is, the output signal Out4$m$ is supplied to the third reverse-phase input TCFB2$m$ via a resistor R46 and the reference voltage VREF is supplied to the third positive-phase input TCFB2$p$ via a resistor R47. Consequently, as indicated by Out4$m$ in the medium signal mode in FIG. 9, the control loop for the third positive-phase input TCFB2$p$ and the third reverse-phase input TCFB2$m$ operates to equalize the output signal Out4$m$ to the reference voltage VREF.

An electric current IL1 used in the load of the first channel Ch1 is used in the load of the second channel Ch2 via a current line of the first switch circuit SWL. Similarly, an electric current IL2 used in the load of the fourth channel Ch4 is used in the load of the third channel Ch3 via a current line of the second switch circuit SWR.

An electric current is consumed for each channel in the conventional AB-class. On the other hand, since an electric current is consumed for each two channels in the medium signal mode, entire input power is 0.5 times as large as that in the AB-class. The consumption efficiency η is improved compared with the AB-class.

FIG. 10 is a diagram showing a driving state example in the large signal mode. FIG. 11 is a diagram showing output signal examples in the small signal mode, the medium signal mode, and the large signal mode. Periods of the small signal mode, the medium signal mode, and the large signal mode are indicated by arrows in a half cycle of an input signal.

During the large signal mode, since the first to third switch circuits SWL, SWR, and SWM are in an OFF state, the first control switches SWC1 to SWC4 are off and the selection circuits SEL1 to SEL4 are selecting the resistor R6 side. On the other hand, the second control switches SWC1_X to SWC4_X are on.

In the first BTL amplifier B1, when the medium signal mode is switched to the large signal mode, the control loop operates to retain, with sample-hold action of the control loop, a common mode voltage of the output signals Out1$p$ and Out1$m$ at a value immediately before the first control switch SWC is switched from ON to Off. The common mode voltage of the output signals Out1$p$ and Out1$m$ may be monitored or only a direct-current voltage of the output signal Out1$p$ may be monitored. The control loop for equalizing the output signal Out1$m$ to the reference voltage VREF is not operating. However, since differential feedback is maintained, output amplitude of the output signal Out1$m$ appears to set a differential gain to a fixed prescribed value. The second to fourth BTL amplifiers B2 to B4 operate in the same manner.

An electric current IL3 used in the load of the first channel Ch1 is discharged. Similarly, an electric current IL4 used in the load of the second channel Ch2 is discharged, an electric current IL5 used in the load of the third channel Ch3 is discharged, and an electric current IL6 used in the load of the fourth channel Ch4 is discharged. Since an electric current is consumed for each channel in the large signal mode in this way, the consumption efficiency η is equivalent to the consumption efficiency q in the AB-class. In this embodiment, the modes transition to the large signal mode through the small signal mode and the medium signal mode. Therefore, the consumption efficiency η for one cycle is improved compared with the AB-class.

Figure 12:
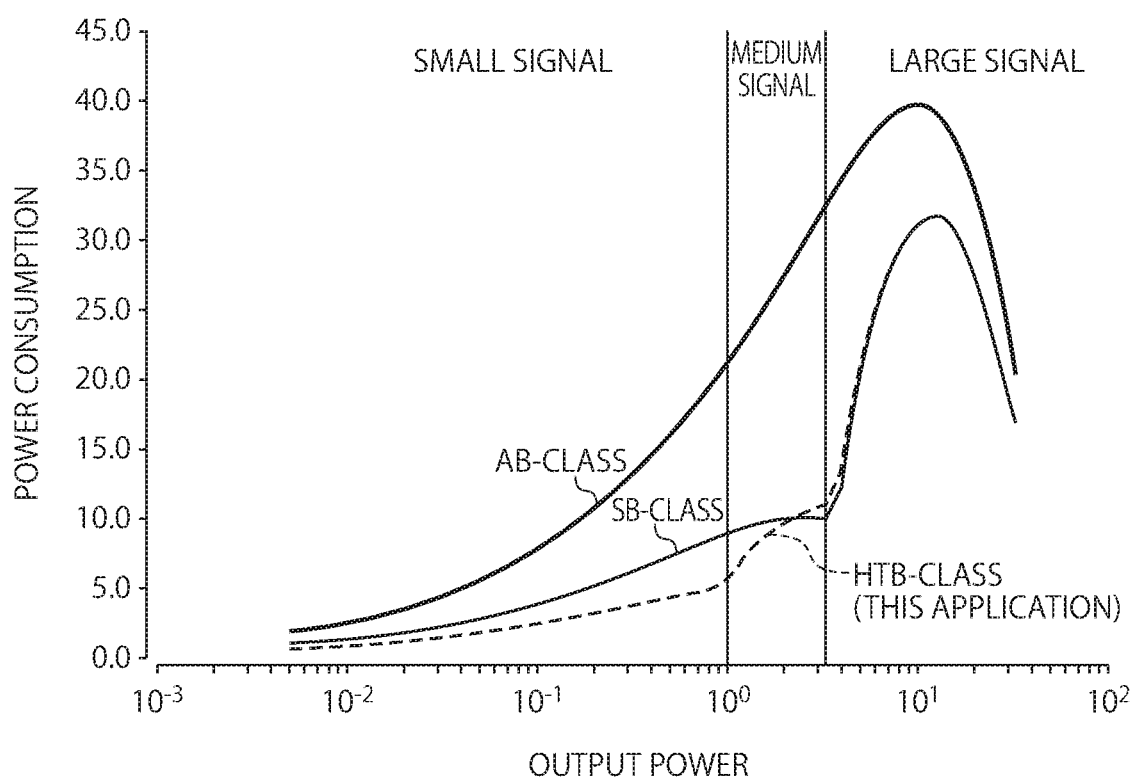
FIG. 12 is a diagram for comparing power consumptions.

FIG. 12 is a diagram for comparing power consumptions. The horizontal axis indicates output power and the vertical axis indicates power consumption. An SB-class is a scheme for switching a bridge and a single according to a signal level between lines of a single rail.

In this embodiment, a characteristic (an HTB-class) of a lower power loss than the amplifiers of the AB-class and the SB-class is explained. In the small signal mode, power consumption is a quarter compared with the AB-class. A consumed current equivalent to a consumed current in the SB-class is generated in the medium signal mode. A consumed current equivalent to a consumed current in the AB-class is generated in the large signal mode. However, in this embodiment, an output signal involves zero-cross like a sine wave even if the output signal is a large signal and transitions through the small signal mode and the medium signal mode. Therefore, entire power consumption is small compared with the SB-class and the AB-class.

As explained above, according to this embodiment, in the small signal mode, the electric current IL is fed to the loads of the first to fourth BTL amplifiers B1 to B4. Consequently, it is possible to reduce power consumption.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A power amplifying device comprising:
a first BTL amplifier including bridge-connected first and second output amplifiers and configured to output a first output signal obtained by amplifying a first input signal;
a second BTL amplifier including bridge-connected third and fourth output amplifiers and configured to output a second output signal obtained by amplifying a second input signal;
a third BTL amplifier including bridge-connected fifth and sixth output amplifiers and configured to output a third output signal obtained by amplifying a third input signal;
a fourth BTL amplifier including bridge-connected seventh and eighth output amplifiers and configured to output a fourth output signal obtained by amplifying a fourth input signal;
a first switch circuit turned on to establish connection between an output of the second output amplifier and an output of the third output amplifier or turned off to break the connection between the output of the second output amplifier and the output of the third output amplifier;
a second switch circuit turned on to establish connection between an output of the fifth output amplifier and an output of the eighth output amplifier or turned off to break the connection between the output of the fifth output amplifier and the output of the eighth output amplifier; and
a third switch circuit turned on to establish connection between an output of the fourth output amplifier and an output of the seventh output amplifier or turned off to break the connection between the output of the fourth output amplifier and the output of the seventh output amplifier, wherein
the first to third switch circuits are turned on when amplitudes of the first to fourth input signals are smaller than a first threshold,
wherein the first and second switch circuits are turned on and the third switch circuit is turned off when the amplitudes of the first to fourth input signals are equal to or smaller than a second threshold larger than the first threshold and one of the amplitudes of the second and fourth input signals is equal to or larger than the first threshold.

2. The power amplifying device according to claim 1, wherein
the first switch circuit is turned off when the amplitude of one of the first and second input signals is equal to or larger than the second threshold,
the second switch circuit is turned off when the amplitude of one of the third and fourth input signals is equal to or larger than the second threshold, and
the third switch circuit is turned off when the amplitude of one of the second and fourth input signals is equal to or larger than the first threshold.

3. A power amplifying device comprising:
a first BTL amplifier including bridge-connected first and second output amplifiers and configured to output a first output signal obtained by amplifying a first input signal;
a second BTL amplifier including bridge-connected third and fourth output amplifiers and configured to output a second output signal obtained by amplifying a second input signal;
a third BTL amplifier including bridge-connected fifth and sixth output amplifiers and configured to output a third output signal obtained by amplifying a third input signal;
a fourth BTL amplifier including bridge-connected seventh and eighth output amplifiers and configured to output a fourth output signal obtained by amplifying a fourth input signal;
a first switch circuit turned on to establish connection between an output of the second output amplifier and an output of the third output amplifier or turned off to break the connection between the output of the second output amplifier and the output of the third output amplifier;
a second switch circuit turned on to establish connection between an output of the fifth output amplifier and an output of the eighth output amplifier or turned off to break the connection between the output of the fifth output amplifier and the output of the eighth output amplifier; and
a third switch circuit turned on to establish connection between an output of the fourth output amplifier and an output of the seventh output amplifier or turned off to break the connection between the output of the fourth output amplifier and the output of the seventh output amplifier;

a first control circuit configured to control the outputs of the first output amplifier and the second output amplifier according to the first input signal;

a second control circuit configured to control the outputs of the third output amplifier and the fourth output amplifier according to the second input signal;

a third control circuit configured to control the outputs of the fifth output amplifier and the sixth output amplifier according to the third input signal; and a fourth control circuit configured to control the outputs of the seventh output amplifier and the eighth output amplifier according to the fourth input signal, wherein the first to third switch circuits are turned on when amplitudes of the first to fourth input signals are smaller than a first threshold.

4. The power amplifying device according to claim 1, wherein the first to eighth output amplifiers are respectively connected between a first potential line to which first potential is supplied and a second potential line to which second potential lower than the first potential is supplied, the first threshold is set such that, when the amplitudes of the first to fourth input signals are smaller than the first threshold, amplitudes of the first to fourth output signals are equal to or smaller than a quarter of a potential difference between the first potential and the second potential, and the second threshold is set such that, when the amplitudes of the first to fourth input signals are smaller than the second threshold, the amplitudes of the first to fourth output signals are equal to or smaller than a half of the potential difference between the first potential and the second potential.

5. The power amplifying device according to claim 3, wherein the first control circuit controls gains of the first and second output amplifiers such that a differential gain of the first BTL amplifier is a prescribed value, the second control circuit controls gains of the third and fourth output amplifiers such that a differential gain of the second BTL amplifier is the prescribed value, the third control circuit controls gains of the fifth and sixth output amplifiers such that a differential gain of the third BTL amplifier is the prescribed value, and the fourth control circuit controls gains of the seventh and eighth output amplifiers such that a differential gain of the fourth BTL amplifier is the prescribed value.

6. The power amplifying device according to claim 5, wherein when the first to third switch circuits are on, the second control circuit sets the output of the fourth output amplifier to first reference potential and the fourth control circuit sets the output of the seventh output amplifier to the first reference potential, and when the first to third switch circuits are off, the first control circuit sets the output of the second output amplifier to the first reference potential, the second control circuit sets the output of the third output amplifier to the first reference potential, the third control circuit sets the output of the fifth output amplifier to the first reference potential, and the fourth control circuit sets the output of the eighth output amplifier to the first reference potential.

7. The power amplifying device according to claim 5, wherein the first control circuit includes:

a differential output circuit, to an input of which the first input signal is input, the differential output circuit outputting a differential signal based on the first input signal from a first and a second outputs;

a first resistor, one end of which is connected to the first output and another end of which is connected to a first positive-phase input of the first output amplifier and a first reverse-phase input of the second output amplifier;

a second resistor, one end of which is connected to the second output and another end of which is connected to a first positive-phase input of the second output amplifier and a first reverse-phase input of the first output amplifier;

a third resistor, one end of which is connected to the other end of the first resistor and another end of which is connected to an output of the second output amplifier;

a fourth resistor, one end of which is connected to the other end of the second resistor and another end of which is connected to an output of the first output amplifier;

a fifth resistor, one end of which is connected to the output of the first output amplifier and another end of which is connected to a second reverse-phase input of the first output amplifier and a second reverse-phase input of the second output amplifier;

an eighth resistor, one end of which is connected to the output of the second output amplifier and another end of which is connected to the other end of the fifth resistor;

a first control switch, one end of a current path of which is connected to the other end of the fifth resistor and another end of the current path of which is connected to a second positive-phase input of the first output amplifier and a second positive-phase input of the second output amplifier, the first control switch being turned on or off in synchronization with the first switch circuit;

a capacitor, to one end of which the first reference potential is supplied, another end of the capacitor being connected to another end of the current path of the first control switch;

a sixth resistor, one end of which is connected to the output of the second output amplifier;

a ninth resistor, one end of which is connected to one end of the third switch circuit;

a selection circuit, one end of which is connected to another end of the sixth resistor in synchronization with the third switch circuit or another end of the ninth resistor and another end of which is connected to a third reverse-phase input of the first output amplifier and a third reverse-phase input of the second output amplifier;

a second control switch, one end of a current path of which is connected to the other end of the selection circuit and another end of the current path of which is connected to a third positive-phase input of the first output amplifier and connected to a third positive-phase input of the second output amplifier, the second control switch being turned on or off complementarily to the first control switch; and a seventh resistor, to one end of which the first reference potential is supplied and another end of which is connected to the other end of the current path of the second control switch, the first output amplifier outputs, from the output terminal, a signal corresponding to a potential difference between the first positive-phase input and the first reverse-phase input, a potential difference between the second positive-phase input and the second reverse-phase input, and a potential difference between the third positive-phase input and the third reverse-phase input of the first output amplifier, and the second output amplifier outputs, from the output terminal, a signal corresponding to a potential difference between the first positive-phase input and the first reverse-phase input, a potential difference between the second positive-phase input and the second reverse-phase input, and a potential difference between the third positive-phase input and the third reverse-phase input of the second output amplifier.

8. The power amplifying device according to claim 7, wherein
the first output amplifier includes:
a first MOS transistor, one end of a current path of which is connected to a current supply terminal and another end of the current path of which is connected to an output terminal; and
a second MOS transistor, one end of the current path of which is connected to the output terminal and another end of the current path of which is connected to a current sweep-out terminal, and
the first output amplifier controls the first MOS transistor and the second MOS transistor to be turned on or off in a complementary manner according to the potential difference between the first positive-phase input and the first reverse-phase input, the potential difference between the second positive-phase input and the second reverse-phase input, and the potential difference between the third positive-phase input and the third reverse-phase input of the first output amplifier.

9. The power amplifying device according to claim 2, further comprising:
a first comparator configured to output, when the amplitudes of the first and second input signals are smaller than the second threshold, a signal for turning on the first switch circuit and output, when at least one of the amplitudes of the first and second input signals is equal to or larger than the second threshold, a signal for turning off the first switch circuit;
a second comparator configured to output, when the amplitudes of the third and fourth input signals are smaller than the second threshold, a signal for turning on the second switch circuit and output, when at least one of the amplitudes of the third and fourth input signals is equal to or larger than the second threshold, a signal for turning off the second switch circuit; and
a third comparator configured to output, when the amplitudes of the first to fourth input signals are smaller than the first threshold, a signal for turning on the third switch circuit and output, when the amplitude of at least any one of the second and fourth input signals is equal to or larger than the first threshold, a signal for turning off the third switch circuit.

10. Audio equipment comprising a power amplifying device, wherein the power amplifying device includes:
a first BTL amplifier including bridge-connected first and second output amplifiers and configured to output a first output signal obtained by amplifying a first input signal;
a second BTL amplifier including bridge-connected third and fourth output amplifiers and configured to output a second output signal obtained by amplifying a second input signal;
a third BTL amplifier including bridge-connected fifth and sixth output amplifiers and configured to output a third output signal obtained by amplifying a third input signal;
a fourth BTL amplifier including bridge-connected seventh and eighth output amplifiers and configured to output a fourth output signal obtained by amplifying a fourth input signal;
a first switch circuit turned on to establish connection between an output of the second output amplifier and an output of the third output amplifier or turned off to break the connection between the output of the second output amplifier and the output of the third output amplifier;
a second switch circuit turned on to establish connection between an output of the fifth output amplifier and an output of the eighth output amplifier or turned off to break the connection between the output of the fifth output amplifier and the output of the eighth output amplifier; and
a third switch circuit turned on to establish connection between an output of the fourth output amplifier and an output of the seventh output amplifier or turned off to break the connection between the output of the fourth output amplifier and the output of the seventh output amplifier, and
the first to third switch circuits are turned on when amplitudes of the first to fourth input signals are smaller than a first threshold,
wherein the first and second switch circuits are turned on and the third switch circuit is turned off when the amplitudes of the first to fourth input signals are equal to or smaller than a second threshold larger than the first threshold and one of the amplitudes of the second and fourth input signals is equal to or larger than the first threshold.

11. The audio equipment according to claim 10, wherein
the first switch circuit is turned off when the amplitude of one of the first and second input signals is equal to or larger than the second threshold,
the second switch circuit is turned off when the amplitude of one of the third and fourth input signals is equal to or larger than the second threshold, and
the third switch circuit is turned off when the amplitude of one of the second and fourth input signals is equal to or larger than the first threshold.

12. The audio equipment according to claim 10, wherein the power amplifying device further includes:
a first control circuit configured to control the outputs of the first output amplifier and the second output amplifier according to the first input signal;
a second control circuit configured to control the outputs of the third output amplifier and the fourth output amplifier according to the second input signal;
a third control circuit configured to control the outputs of the fifth output amplifier and the sixth output amplifier according to the third input signal; and
a fourth control circuit configured to control the outputs of the seventh output amplifier and the eighth output amplifier according to the fourth input signal.

13. The audio equipment according to claim 10, wherein
the first to eighth output amplifiers are respectively connected between a first potential line to which first potential is supplied and a second potential line to which second potential lower than the first potential is supplied, the first threshold is set such that, when the amplitudes of the first to fourth input signals are smaller than the first threshold, amplitudes of the first to fourth output signals are equal to or smaller than a quarter of a potential difference between the first potential and the second potential, and the second threshold is set such that, when the amplitudes of the first to fourth input signals are smaller than the second threshold, the amplitudes of the first to fourth output signals are equal to or smaller than a half of the potential difference between the first potential and the second potential.

14. The audio equipment according to claim 12, wherein the first control circuit controls gains of the first and second output amplifiers such that a differential gain of the first BTL amplifier is a prescribed value, the second control circuit controls gains of the third and fourth output amplifiers such that a differential gain of the second BTL amplifier is the prescribed value, the third control circuit controls gains of the fifth and sixth output amplifiers such that a differential gain of the third BTL amplifier is the prescribed value, and the fourth control circuit controls gains of the seventh and eighth output amplifiers such that a differential gain of the fourth BTL amplifier is the prescribed value.

15. The audio equipment according to claim 14, wherein when the first to third switch circuits are on, the second control circuit sets the output of the fourth output amplifier to first reference potential and the fourth control circuit sets the output of the seventh output amplifier to the first reference potential, and when the first to third switch circuits are off, the first control circuit sets the output of the second output amplifier to the first reference potential, the second control circuit sets the output of the third output amplifier to the first reference potential, the third control circuit sets the output of the fifth output amplifier to the first reference potential, and the fourth control circuit sets the output of the eighth output amplifier to the first reference potential.

16. The audio equipment according to claim 14, wherein the first control circuit includes:

a differential output circuit, to an input of which the first input signal is input, the differential output circuit outputting a differential signal based on the first input signal from a first and a second outputs;

a first resistor, one end of which is connected to the first output and another end of which is connected to a first positive-phase input of the first output amplifier and to a first reverse-phase input of the second output amplifier;

a second resistor, one end of which is connected to the second output and another end of which is connected to a first positive-phase input of the second output amplifier and a first reverse-phase input of the first output amplifier;

a third resistor, one end of which is connected to the other end of the first resistor and another end of which is connected to an output of the second output amplifier;

a fourth resistor, one end of which is connected to the other end of the second resistor and another end of which is connected to an output of the first output amplifier;

a fifth resistor, one end of which is connected to the output of the first output amplifier and another end of which is connected to a second reverse-phase input of the first output amplifier and a second reverse-phase input of the second output amplifier;

an eighth resistor, one end of which is connected to the output of the second output amplifier and another end of which is connected to the other end of the fifth resistor;

a first control switch, one end of a current path of which is connected to the other end of the fifth resistor and another end of the current path of which is connected to a second positive-phase input of the first output amplifier and a second positive-phase input of the second output amplifier, the first control switch being turned on or off in synchronization with the first switch circuit;

a capacitor, to one end of which the first reference potential is supplied, another end of the capacitor being connected to another end of the current path of the first control switch;

a sixth resistor, one end of which is connected to the output of the second output amplifier;

a ninth resistor, one end of which is connected to one end of the third switch circuit;

a selection circuit, one end of which is connected to another end of the sixth resistor in synchronization with the third switch circuit or another end of the ninth resistor and another end of which is connected to a third reverse-phase input of the first output amplifier and a third reverse-phase input of the second output amplifier;

a second control switch, one end of a current path of which is connected to the other end of the selection circuit and another end of the current path of which is connected to a third positive-phase input of the first output amplifier and connected to a third positive-phase input of the second output amplifier, the second control switch being turned on or off complementarily to the first control switch; and a seventh resistor, to one end of which the first reference potential is supplied and another end of which is connected to the other end of the current path of the second control switch, the first output amplifier outputs, from the output terminal, a signal corresponding to a potential difference between the first positive-phase input and the first reverse-phase input, a potential difference between the second positive-phase input and the second reverse-phase input, and a potential difference between the third positive-phase input and the third reverse-phase input of the first output amplifier, and the second output amplifier outputs, from the output terminal, a signal corresponding to a potential difference between the first positive-phase input and the first reverse-phase input, a potential difference between the second positive-phase input and the second reverse-phase input, and a potential difference between the third positive-phase input and the third reverse-phase input of the second output amplifier.

17. The audio equipment according to claim 16, wherein the first output amplifier includes:

a first MOS transistor, one end of a current path of which is connected to a current supply terminal and another end of the current path of which is connected to an output terminal; and a second MOS transistor, one end of the current path of which is connected to the output terminal and another end of the current path of which is connected to a current sweep-out terminal, and the first output amplifier controls the first MOS transistor and the second MOS transistor to be turned on or off in a complementary manner according to the potential difference between the first positive-phase input and the first reverse-phase input, the potential difference between the second positive-phase input and the second reverse-phase input, and the potential difference between the third positive-phase input and the third reverse-phase input of the first output amplifier.

18. The audio equipment according to claim 11, wherein the power amplifying device further includes:
   a first comparator configured to output, when the amplitudes of the first and second input signals are smaller than the second threshold, a signal for turning on the first switch circuit and output, when at least one of the amplitudes of the first and second input signals is equal to or larger than the second threshold, a signal for turning off the first switch circuit;
   a second comparator configured to output, when the amplitudes of the third and fourth input signals are smaller than the second threshold, a signal for turning on the second switch circuit and output, when at least one of the amplitudes of the third and fourth input signals is equal to or larger than the second threshold, a signal for turning off the second switch circuit; and
   a third comparator configured to output, when the amplitudes of the first to fourth input signals are smaller than the first threshold, a signal for turning on the third switch circuit and output, when the amplitude of at least any one of the second and fourth input signals is equal to or larger than the first threshold, a signal for turning off the third switch circuit.

* * * * *